United States Patent [19]

Mouissie

[11] 4,109,986

[45] Aug. 29, 1978

[54] ELECTRICAL CONNECTOR AND CONTACT

[75] Inventor: Bob Mouissie, Berlicum, Netherlands

[73] Assignee: E. I. Du Pont de Nemours and Company, Wilmington, Del.

[21] Appl. No.: 755,128

[22] Filed: Dec. 28, 1976

[30] Foreign Application Priority Data

Dec. 31, 1975 [NL] Netherlands ........................ 7515251

[51] Int. Cl.² ............................................. H05K 1/07

[52] U.S. Cl. .......................... 339/17 L; 339/176 MP; 339/256 S

[58] Field of Search ............ 339/17 L, 176 R, 176 M, 339/176 MP, 256 R, 256 S, 256 SP, 258 R, 262 R

[56] References Cited

U.S. PATENT DOCUMENTS

| | | | |
|---|---|---|---|
| 3,317,888 | 5/1967 | Mancini | 339/258 R |
| 3,654,595 | 4/1972 | Curr | 339/256 R |

FOREIGN PATENT DOCUMENTS

| | | | |
|---|---|---|---|
| 704,057 | 2/1965 | Canada | 339/256 R |
| 1,383,296 | 2/1975 | United Kingdom | 339/176 MP |

*Primary Examiner*—Roy Lake
*Assistant Examiner*—E. F. Desmond

[57] ABSTRACT

An electrical connector includes an improved dual metal contact comprising a support and an arcuately stressed plate spring having each end fixedly mounted to the support. The spring is adapted to deflect and resiliently flex at its midpoint during engagement of a mating contact, at which time the spring surfaces on both sides of its midpoint resiliently engage the mating contact. The initial deflection of the midpoint of the arcuately stressed spring provides for a low insertion force, and the resilient flexure of the spring provides a redundant contact surface with enhanced contact force between the surface of the spring and mating contact.

4 Claims, 4 Drawing Figures

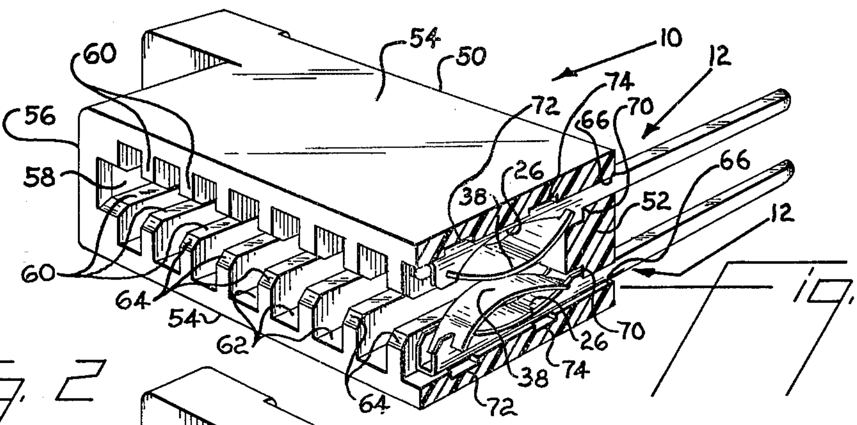
Fig. 1
Fig. 2
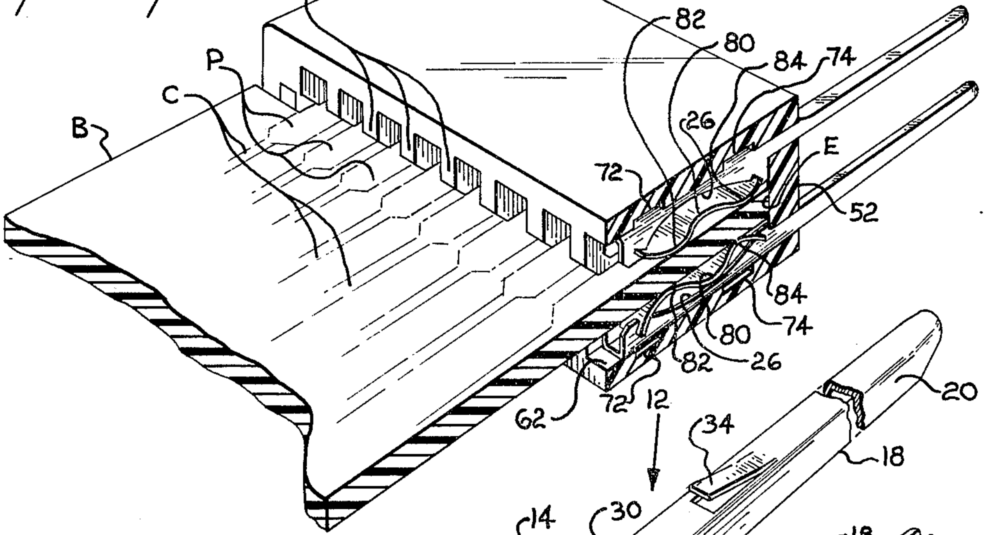
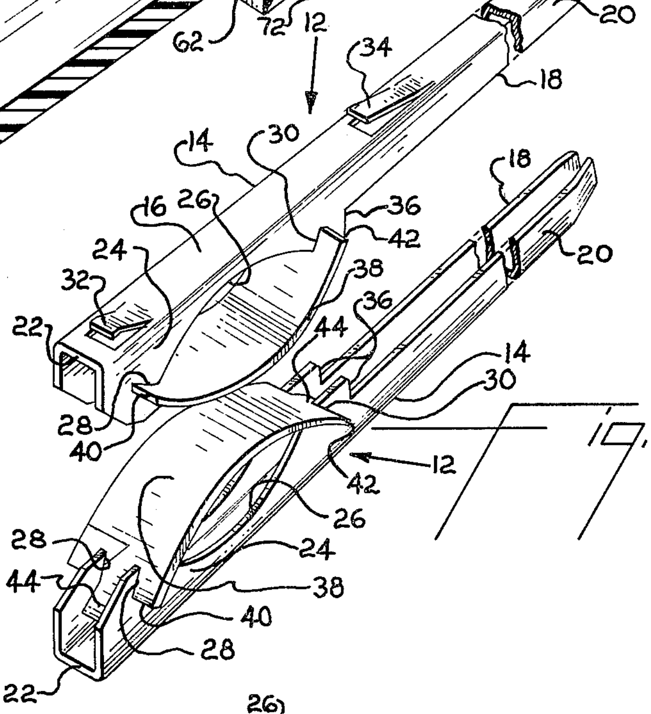
Fig. 3
Fig. 4
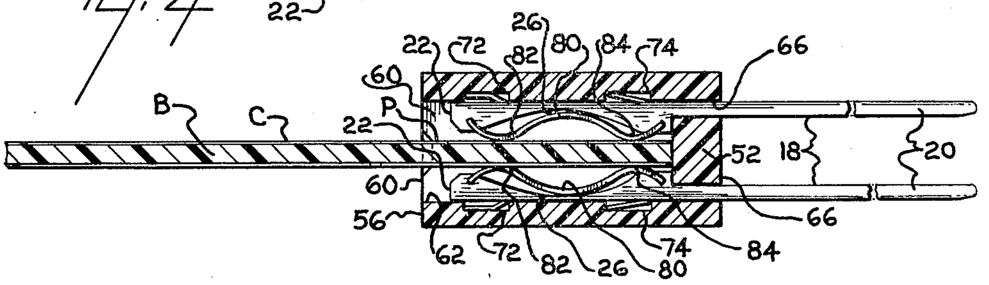

ELECTRICAL CONNECTOR AND CONTACT

BACKGROUND OF THE INVENTION

1. Field of the Invention:

The present invention relates to a contact for use in electrical connectors and particularly relates to a dual metal contact.

2. Description of the Prior Art:

Dual metal contacts are described in Mancini, U.S. Pat. No. 3,317,888 and in Berg, U.S. Pat. No. 3,370,265. The aforementioned patent describes a dual or bi-metal circuit board pin comprising a base and a spring metal contact leaf. The contact leaf is fixedly mounted to the base at one end and retained by a hook on the base at the other end. The latter mentioned patent describes a contact comprising a socket and a bowed contact spring. The contact spring is confined in the socket but is free to move relative to the socket. In both of these contacts, the base or socket may be made of a malleable metal of high electrical conductivity, e.g. brass, copper or phosphor bronze, and the spring may be made of a resilient spring metal, e.g. a spring steel, beryllium copper or other spring metals or alloys. Both the base or support and the spring may be plated or coated with a corrosion resistant layer, e.g. gold or tin-lead, to assure a good electrical contact between the contact and a mating contact. In both of the above contacts the spring is bowed and, upon engagement with a mating contact, the spring is deflected and flattened at its mid-point to provide a flat area of contact between the spring and mating contact with a force proportional to the deflection of the spring. A plug jack connector is described in Klassen, U.S. Pat. No. 3,273,105. The connector includes a contact having two spaced bends on both sides of its midpoint.

SUMMARY OF THE INVENTION

According to the present invention, a contact is provided comprising a support and an arcuately stressed plate spring having each end fixedly mounted to the support, the spring being adapted to deflect and flex at a midpoint of the spring during engagement by a mating contact. The spring surfaces on both sides of the midpoint of the spring resiliently engage the mating contact with an enhanced spring force.

BRIEF DESCRIPTION OF THE DRAWINGS

FIG. 1 is a perspective view of a preferred embodiment of the invention illustrating a circuit board connector.

FIG. 2 is a view similar to FIG. 1 illustrating a circuit board inserted in the connector.

FIG. 3 is a perspective view of a pair of contacts according to a preferred embodiment of the invention.

FIG. 4 is a sectional elevation of the circuit board and connector of FIG. 2.

DESCRIPTION OF PREFERRED EMBODIMENTS

Preferred embodiments of a contact and circuit board connector according to the invention are described below with reference to the attached drawings wherein the same numerals are used throughout the various views to illustrate the same elements.

A circuit board connector 10 having a plurality of contacts 12 mounted therein is illustrated in FIG. 1. With particular reference to FIG. 3, each contact 12 includes a support 14 having a flat back wall 16. Support 14 has a U-shaped tail 18 at one end having side walls 20, and a mounting end 22 which is also U-shaped having upstanding side walls 24 joined with side walls 20 of tail 18. Each side wall 24 has a recess 26 intermediate its ends. Oppositely inclined notches 28, 30 are provided in each side wall 24. Lanced tabs 32, 34 are provided in back wall 16. An end 36 of each side wall 24 joins side wall 20 of the tail 18.

A plate spring 38 is arcuately stressed and each end 40, 42 is fixedly mounted, respectively, in notches 28, 30 of upstanding side walls 24. Each end 40, 42 is constrained at a distance equal to a chord subtending the arc of the stressed spring 38. A tongue 44 extends from each end 40, 42 of plate spring 38 between side walls 24 of the mounting end 22 to prevent lateral movement or twisting of spring 38. The spring 38 is wider than the back wall 14.

A dielectric housing 50 includes a base 52, a pair of side walls 54, and a pair of end walls 56 (one shown). A slot 58 extends a length of the housing 50 between side walls 54 and end walls 56. A plurality of spaced lands 60 on the interior of each side wall 54 provide recesses 62 for contacts 12. A lead-in surface 64 is provided on each land 60. An aperture 66 is provided in the base 52 for each recess 62 and includes a stepped segment 70. Windows 72, 74 are provided in the interior of each side wall 54 between lands 60.

A contact 12 is mounted in each recess 62 with the tail 18 extending through the base 52 with the end 36 of each upstanding side wall 24 engaging the stepped portion 70 of each aperture 66. Lanced tabs 32, 34 on the back wall 16 of each support 14 engage windows 72, 74 to retain each contact 12 in the housing 50.

A circuit board B having a plurality of conductive paths C on both sides thereof and conductive pads P on a surface thereof adjacent an edge E of the board B is inserted in the slot 58. Upon insertion of the edge E of board B in the slot 58 of housing 50, each conductive pad P engages an arcuately stressed plate spring 38 of a contact 12. Each spring 38 deflects at its midpoint 80 as the edge E is inserted lightly wiping the conductive pad P to destroy any oxides which may have formed on the pad P and surface of the spring 38. When the edge E of the board B passes the midpoint of each spring 38, the midpoint of the spring 38 resiliently flexes and the spring force against the conductive pad P is transferred to the surface of the spring 38 on both sides of its midpoint 80.

The initial deflection of spring 38 of each contact 12 causes a light contact force against each mating contact pad P and the initial force required for insertion of the edge E of the circuit board B in the connector is low. This provides for reduced wear on both the conductive pad P and the contact surface of the spring 38 during initial insertion of the edge E of the circuit board B. When the edge E of the circuit board B passes the midpoint of the spring, the contact force between each pad P and the contact surface of the spring increases until the midpoint of the spring resiliently flexes, causing a trough at the midpoint 80 of the spring and crests, 82, 84 on both sides of the trough. The trough is deflected in a recess 26 in side walls 24 of support 14 and may engage walls 24 to prevent overstressing of the spring 38. The two crests 82, 84 on both sides of the trough provide a total contact force which is greater than the initial contact force during insertion of the circuit board B.

The two crests 82, 84 provide a redundant contact surface with the pad P and increased contact reliability.

The support 14 of contact 12 is made from a malleable metal of high electrical conductivity, e.g. brass, copper or phosphor bronze, and the plate spring 38 is made from a resilient spring metal, e.g. spring steel, beryllium copper or other spring metals or alloys. Both the support and the plate spring may be plated or coated with a corrosion resistant, conductive metal layer or plating, e.g. gold or tin-lead, to assure good electrical contact with a mating contact. The housing 50 is made from a suitable dielectric material, e.g. nylon or polyester, which may be glass filled or otherwise reinforced.

What is claimed is:

1. A printed circuit board connector comprising a dielectric housing having a slot extending along a length thereof and a plurality of opposed pairs of contacts mounted in said housing, each contact comprising a U-shaped support and plate spring, said support including a spaced pair of upstanding walls, each wall having a pair of oppositely inclinded notches, the ends of said spring being fixed in said notches, said spring being restrained in an arcuately stressed condition when so fixed and thereby being adapted to deflect and resiliently flex at its midpoint during insertion of a board into the slot and to engage the board on both sides of the midpoint, each wall being recessed to clear said midpoint.

2. A connector as recited in claim 1, said spring having a width greater than the distance between said spaced walls.

3. A contact consisting of a U-shaped support with upstanding spaced side walls, a tail extending from the support and an elongated plate spring, each wall having a pair of oppositely inclined notches, said spring being arcuately stressed with its ends fixed in said notches and thereby being adapted to flex resiliently toward said support at its midpoint, each wall being recessed to clear said midpoint.

4. A contact according to claim 3, said spring having a width greater than the distance between said spaced walls.

* * * * *